(12) United States Patent
Schroeder et al.

(10) Patent No.: US 7,648,805 B2
(45) Date of Patent: Jan. 19, 2010

(54) MASKS AND METHODS OF MANUFACTURE THEREOF

(75) Inventors: Uwe Paul Schroeder, Lake Carmel, NY (US); Chung-Hsi J. Wu, Wappingers Falls, NY (US)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 446 days.

(21) Appl. No.: 11/634,619

(22) Filed: Dec. 6, 2006

(65) Prior Publication Data

US 2008/0138588 A1    Jun. 12, 2008

(51) Int. Cl.
  *G03F 1/00* (2006.01)
(52) U.S. Cl. ............................................. 430/5

(58) Field of Classification Search .................... 430/5, 430/394; 716/19, 20, 21
See application file for complete search history.

(56) References Cited

U.S. PATENT DOCUMENTS

| | | |
|---|---|---|
| 5,242,770 A | 9/1993 | Chen et al. |
| 5,821,014 A | 10/1998 | Chen et al. |
| 6,413,683 B1 * | 7/2002 | Liebmann et al. ............... 430/5 |

* cited by examiner

*Primary Examiner*—Stephen Rosasco
(74) *Attorney, Agent, or Firm*—Slater & Matsil, L.L.P.

(57) ABSTRACT

Lithography masks and methods of manufacture thereof are disclosed. A preferred embodiment includes a method of generating an assist feature of a lithography mask. The method includes providing a layout for a material layer of a semiconductor device, the layout including a pattern for at least one feature of the semiconductor device. The method includes forming an assist feature in the pattern for the at least one feature, wherein the assist feature extends completely through the pattern for the at least one feature.

23 Claims, 7 Drawing Sheets

MASKS AND METHODS OF MANUFACTURE THEREOF

TECHNICAL FIELD

The present invention relates generally to the fabrication of semiconductor devices, and more particularly to the design and fabrication of lithography masks used to pattern features of semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon, forming integrated circuits.

Lithography is a process in which a layer of photosensitive material is deposited over a material layer, and the layer of photosensitive material is patterned by exposing the layer of photosensitive material to energy through a lithography mask. The layer of photosensitive material is then developed, and the patterned layer of photosensitive material is used as a mask while exposed portions of the material layer are etched away.

There is a trend in the semiconductor industry towards reducing the size of features, e.g., the circuits, elements, conductive lines, and vias of semiconductor devices, in order to increase performance of the semiconductor devices, for example. The minimum feature size of semiconductor devices has steadily decreased over time. As feature sizes diminish, the patterning of conductive lines, transistor gates, and other circuit components becomes more challenging.

In particular, as feature sizes are reduced, the transfer of patterns of lithography masks to semiconductor devices may become inaccurate. Diffraction and other effects in a lithography process or system may cause features formed on semiconductor devices to appear differently than patterns on a lithography mask.

Lithography techniques such as optical proximity correction (OPC) are sometimes used in an attempt to alleviate mask transfer problems. In OPC, serifs are formed on patterns on a mask or the widths or lengths of portions of patterns on a mask are adjusted. However, in some applications, these OPC methods have not been shown to adequately solve mask pattern transfer problems in lithography processes.

Thus, what are needed in the art are lithography masks and methods of manufacture thereof, wherein pattern transfer from a mask to a semiconductor device is improved.

SUMMARY OF THE INVENTION

These and other problems are generally solved or circumvented, and technical advantages are generally achieved, by preferred embodiments of the present invention, which provide novel methods of designing and fabricating lithography masks.

In accordance with a preferred embodiment of the present invention, a method of generating an assist feature of a lithography mask includes providing a layout for a material layer of a semiconductor device, the layout including a pattern for at least one feature of the semiconductor device, and forming an assist feature in the pattern for the at least one feature, wherein the assist feature extends completely through the pattern for the at least one feature.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
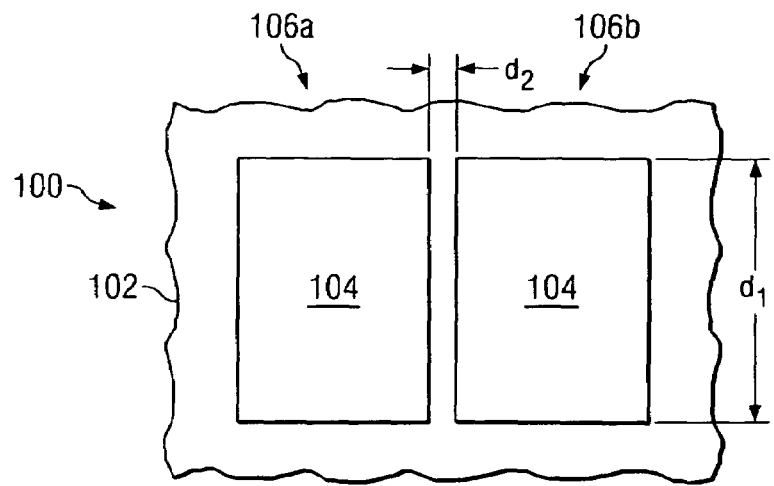
FIGS. 1 through 3 show a method of designing a lithography mask in top views in accordance with a preferred embodiment of the present invention, wherein assist features comprise transparent assist features that extend completely through patterns for features.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In semiconductor device design, placement of clear and dark assist features on lithography masks may be limited in some applications to design shapes above certain widths and run lengths, in order to accommodate mask inspection limitations. As a result, certain two dimensional (2D) (e.g., in an x and y direction on a surface of a semiconductor wafer) design situations result in minimum spaces and lines not being supported by clear and dark assist features, respectively. Even with the use of complicated design rules in a semiconductor design and lithography mask layout process, not all critical situations can be ruled out or accommodated for by current methods of forming assist features. Therefore, 2D designs with poor lithographic process windows cannot be avoided using conventional methods of placing clear and dark assist features.

Embodiments of the present invention achieve technical advantages by using novel methods to place clear or dark assist features in design layouts that involve minimum isolated and semi-isolated resist spaces and line features, where it has been previously impossible to place assist features in the past, thus relieving design rule restrictions. The novel placement methods to be described herein for positioning clear and/or dark sub-resolution assist features (SRAFs) allow the assist features to intersect the design shapes of the main features to be formed, to be described further herein. As a result, the minimum run length argument for placing assist features can be relaxed to the point where 2D lithography process window implications become negligible.

In accordance with embodiments of the present invention, an overextended assist feature is positioned on top of a main feature, e.g., where a minimum space and/or line are detected. As a result, the main feature is separated or "cut" into two separate shapes physically on the mask, e.g., in the case of a clear assist feature, for example. On the wafer, e.g., on the semiconductor device being patterned, the sub-resolution space (e.g., the space in the pattern occupied by the clear assist feature) is filled in and is imaged as continuous, undeveloped photoresist.

The present invention will be described with respect to preferred embodiments in a specific context, namely methods of designing and manufacturing lithography masks used to pattern material layers of semiconductor devices. Embodiments of the present invention may also be used in other applications wherein a mask is used to pattern or print features or shapes on materials, for example. Embodiments of the invention may also be applied to other applications where material layers are patterned, for example, such as semiconductor packaging and other types of technologies. Embodiments of the invention may be implemented in many types of semiconductor devices, such as logic, memory, peripheral circuitry, power applications, and other types of semiconductor devices, as examples.

Figure 2:
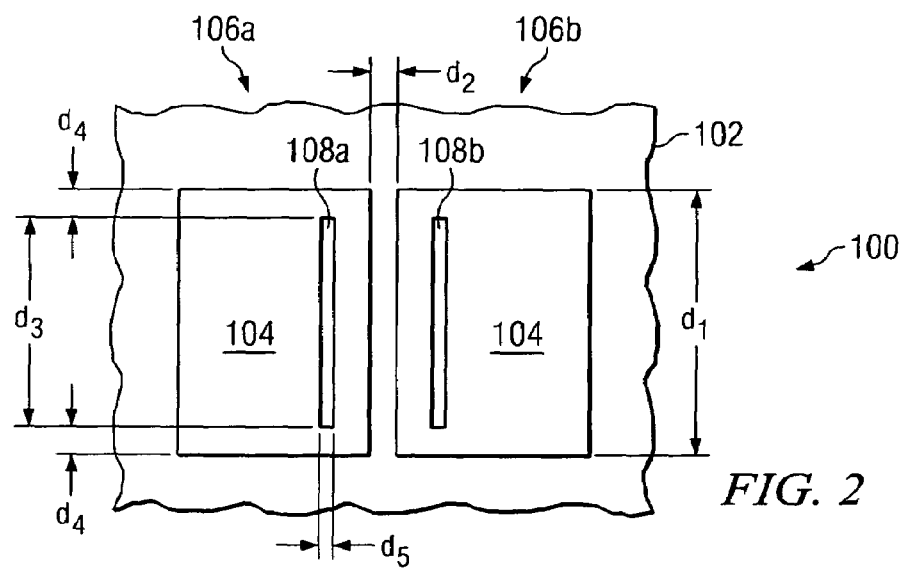
Figure 3:
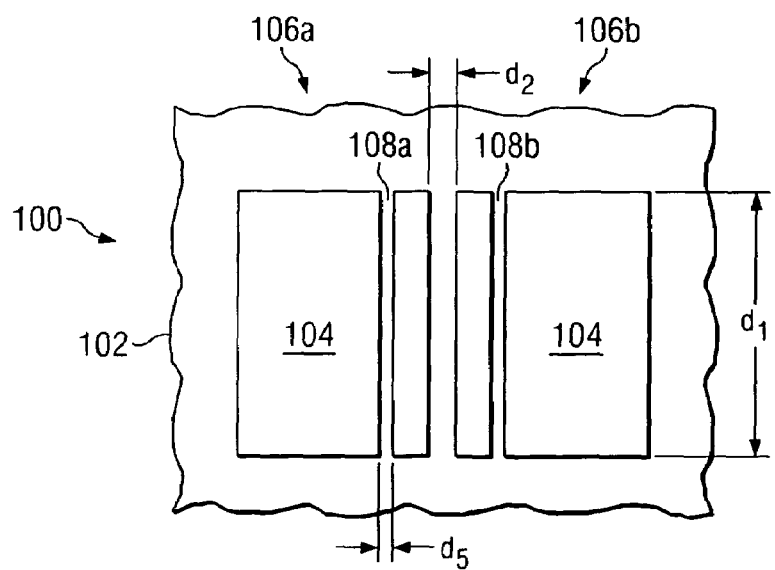

FIGS. 1 through 3 show top views of a method of designing and fabricating a lithography mask 100 in accordance with a preferred embodiment of the present invention at various stages in a design process. Referring first to FIG. 1, a layout for a material layer of a semiconductor device is provided. A portion of the layout is shown on the mask 100 in FIG. 1, for example. The layout comprises pattern 106a and 106b for two rectangular-shaped features of a semiconductor device in this example. The layout includes patterns 106a and 106b formed from an opaque material 104 for two features of a semiconductor device. The patterns 106a and 106b comprise an opaque material 104 that is shaped in a desired shape for a feature of a semiconductor device, disposed on an otherwise transparent background or substrate 102, as shown. The opaque material 104 comprising the patterns 106a and 106b may comprise chromium (Cr), and the transparent substrate 102 may comprise quartz or glass, as examples, although alternatively, other materials may be used for the opaque material 104 and the transparent substrate 102.

In the embodiment shown, the patterns 106a and 106b for the features to be formed on the semiconductor device may comprise a length $d_1$ and may be separated apart by a distance $d_2$, as shown. The length $d_1$ is also referred to herein as a run length and may comprise about 370 nm or greater in a preferred embodiment, for example, although alternatively, length $d_1$ may comprise other dimensions. The distance $d_2$ may comprise a minimum feature size of a semiconductor device or greater, e.g., about 65 nm or less, although alternatively, the distance $d_2$ may comprise other dimensions.

Note that the lithography masks 100 shown in FIGS. 1 and 2 are preferably not actually fabricated or used to manufacture semiconductor devices in accordance with preferred embodiments of the present invention. Rather, the design layout for the lithography mask 100 at various stages is illustrated in a top view in FIGS. 1 and 2. FIG. 3 shows a top view of a lithography mask 100 that is actually fabricated in accordance with embodiments of the present invention, e.g., FIG. 3 shows a mask 100 that is later manufactured and used to fabricate semiconductor devices.

Referring again to FIG. 1, an analysis of the pattern transfer using a particular lithography system, wavelength of light, feature size, and type of resist is performed on the mask 100, and assist features are placed within the patterns 106a and 106b, e.g., as shown at 108a and 108b in FIG. 2, respectively. Clear assist features 108a and 108b formed in the patterns 106a and 106b, respectively, comprise a length $d_3$ that is less than the run length $d_1$ of the features 108a and 108b, and the assist features 108a and 108b are spaced apart from edges of the patterns 104 by a minimum distance $d_4$, in order to avoid mask inspection issues.

However, in accordance with preferred embodiments of the present invention, an additional step is taken when generating the assist features 108a and 108b: the assist features 108a and 108b are extended completely to the edges of the patterns 106a and 106b, as shown in FIG. 3. Thus, the assist features 108a and 108b of patterns 106a and 106b preferably comprise the same length $d_1$ as the run length $d_1$ of the patterns 106a and 106b, as illustrated in FIG. 3. The lithography mask 100 preferably comprises a pattern 106a or 106b for at least one feature of a semiconductor device. The lithography mask 100 preferably comprises an assist feature 108a and 108b disposed in the pattern 106a or 106b for the at least one feature. The assist features 108a and 108b preferably extend completely from a first edge of the pattern 106a or 106b for the at least one feature to a second edge of the pattern 106a or 106b for the at least one feature, wherein the second edge is opposite the first edge, for example. The assist features 108a and 108b preferably extend completely through the pattern 106a and 106b for the at least one feature, for example.

For example, the minimum distance $d_4$ to avoid mask inspection issues may comprise about 40 to 50 nm. However, by extending the assist features 108a and 108b completely to the edges of the patterns 106a and 106b, mask inspection issues are avoided, in accordance with embodiments of the present invention, advantageously.

In some embodiments, the pattern of the lithography mask 100 preferably comprises at least one pattern 106a or 106b for at least one feature of a semiconductor device. The at least one pattern 106a or 106b includes a first edge and a second edge opposite the first edge. Forming the assist features 108a and 108b comprises forming an assist feature 108a or 108b that extends completely from the first edge to the second edge of the pattern 106a or 106b for the at least one feature.

In other embodiments, providing the layout for the material layer of the semiconductor device may comprise providing a layout including a pattern 106a for a first feature of the semiconductor device and a pattern 106b for a second feature of the semiconductor device proximate the pattern 106a for the first feature. A first assist feature 108a is formed in the pattern 106a for the first feature proximate, e.g., close to, the pattern 106b for the second feature, and a second assist feature 108b is formed in the pattern 106b for the second feature proximate the pattern 106a for the first feature. The first assist feature 108a and the second assist feature 108b are preferably spaced apart from an edge of the pattern 106a and 106b, respectively, by about 60 nm or greater proximate the edge of the pattern 106a and 106b proximate the adjacent pattern 106b or 106a, as an example.

In some embodiments, the patterns 106a and 106b for the features of the semiconductor device comprise an opaque pattern, and forming the assist features 108a and 108b in the patterns 106a and 106b for the features comprises forming transparent assist features, as shown in FIG. 3.

In some embodiments, a novel assist feature 108a and 108b placement routine adapted to place completely extended assist features 108a and 108b within patterns 106a and 106b for features of semiconductor devices may be located in software of a design layout tool for lithography masks, or alternatively, the placement routine may be located in an OPC algorithm, as examples. The assist feature placement routine may be adapted to place an overextended assist feature 108a and 108b over a main pattern 106a and 106b wherever a minimum space and/or line is detected, in some embodiments, for example. As a result, the patterns 106a and 106b for main features are separated or cut into two separate shapes physically on the lithography mask 100, e.g., in the case of clear sub-resolution assist features 108a and 108b, as shown in FIG. 3.

In some embodiments, for example, an OPC algorithm may be performed on the design for the layout, either before or after the extended assist features 108a and 108b are disposed over the patterns 106a and 106b for features. For example, in FIG. 3, OPC may be performed after the extended assist features 108a and 108b are disposed over the patterns 106a and 106b. In this embodiment, preferably, the OPC algorithm is programmed not to fill in the assist feature 108a and 108b space, thus leaving the vertex intersection (e.g., the space in dimension $d_4$ shown in FIG. 2 proximate the edges of the patterns 106a and 106b for features) untouched. As a result, ringing along the minimum space, e.g., dimension $d_4$ of the mask 100 shown in FIG. 2, is greatly reduced, and minimum spaces having run lengths $d_1$ that are less than the mask 100 inspection threshold (e.g., about 370 nm for 65 nm CMOS technologies) may be supported by the clear assist features 108a and 108b.

Note that in embodiments of the present invention, the assist features 108a and 108b preferably comprise sub-resolution assist features (SRAFs) and are preferably not imaged by the lithography mask 100 onto a material layer of a semiconductor device. Rather, the assist features 108a and 108b affect the contrast and/or diffraction effects of the light or energy used in an exposure process, improving the image transfer. In some embodiments, for example, the clear assist features 108a and 108b in accordance with embodiments of the present invention comprise a length $d_1$ of about 500 nm or less and a width $d_5$ of about 60 nm or less, although alternatively, the assist features 108a and 108b may comprise other dimensions. The width $d_5$ of the assist features 108a and 108b in some embodiments preferably comprises about 20 to 60 nm, and more preferably comprises about 35 nm, for example. The width $d_5$ of the assist features 108a and 108b preferably comprises an amount relative to the wavelength of energy or light used in an exposure process such that the assist features 108a and 108b will not be imaged onto a layer of photosensitive material, for example. In some embodiments, for example, the size of the main patterns 106a and 106b is preferably about 20 to 100 nm, and in other embodiments, the main patterns 106a and 106b may comprise lines having a thickness of about 40 nm and spaces having a thickness between the lines of about 60 nm, as another example. The distance from an assist feature 108a or 108b to a main pattern 106a or 106b may comprise about 50 to 200 nm or less, for example, and more preferably may comprise about 120 nm in some embodiments, for example.

Figure 4:
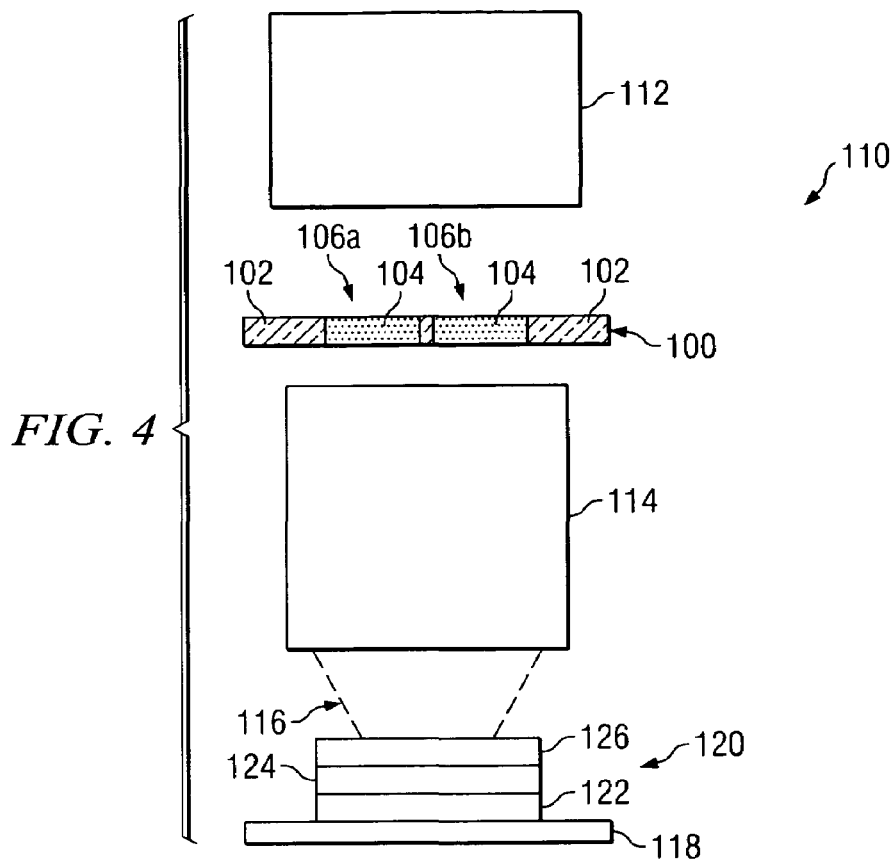
FIG. 4 shows a lithography system implementing the novel lithography mask shown in FIG. 3 in accordance with an embodiment of the present invention.

FIG. 4 shows a lithography system 110 implementing the novel lithography mask 100 shown in FIG. 3 in accordance with an embodiment of the present invention. Embodiments of the present invention include lithography systems 110 that include the novel lithography mask 100. Embodiments of the present invention also include lithography systems 110 that include lithography masks 200 shown in FIG. 8a or 8b, mask 300 shown in FIG. 10, mask 400 shown in FIG. 12, mask 500 shown in FIG. 16, or mask 600 shown in FIG. 19, as examples, to be described further herein.

The lithography system 110 preferably includes an energy source 112, a lithography mask 100 (or masks 200, 300, 500, 500, and 600 shown in FIGS. 8a and 8b, 10, 12, 16, or 19, respectively) comprising extended assist features 108a and 108b (not shown in FIG. 4; see FIG. 3). The lithography mask 110 is disposed between a projection lens system 114 and the energy source 112. The lithography system 110 includes a support means 118 for a semiconductor device 120. The support means 118 may comprise a wafer support adapted to support a wafer or workpiece 122. The wafer support 118 is also referred to as a wafer stage or exposure chuck, for example.

The lithography system 110 may comprise a scanner that includes a means for moving the lithography mask 100 and a means for moving the wafer support 118, for example, not shown. The means for moving the lithography mask 100 and the means for moving the wafer support 118 may comprise motors or steppers that are preferably synchronized, e.g., so that the lithography mask 100 and wafer support 118 are moved in the same or opposite directions at a predetermined relative speed during an exposure process, for example.

The energy source 112 may comprise a light source or other energy source that is adapted to emit light or energy towards the semiconductor device 120. The projection lens system 114 may comprise a plurality of lenses and/or mirrors that are adapted to direct the light or energy towards the semiconductor device 120. The semiconductor device 120 includes a workpiece 122 or substrate having a material layer 124 to be patterned disposed thereon. A layer of photosensitive material 126 comprising photoresist, for example, is disposed over the material layer 124.

Figure 5:
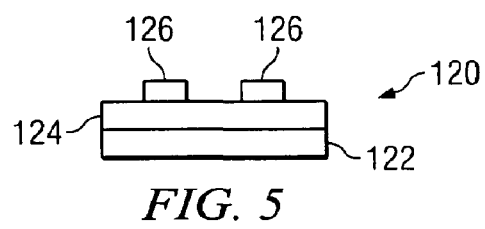
FIG. 5 shows a cross-sectional view of a semiconductor device manufactured in accordance with an embodiment of the present invention using the lithography system shown in FIG. 4.
Figure 6:
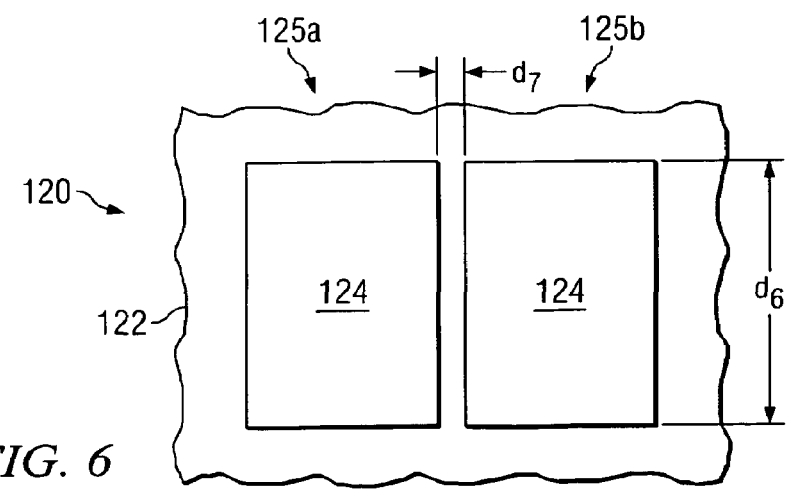
FIG. 6 shows a top view of a semiconductor device manufactured using the mask and lithography system shown in FIG. 4.

When energy is directed towards the semiconductor device 120 through the lithography mask 100, the energy passes through the transparent portions 102 of the mask 100 and is blocked by the opaque portions 104 of the mask 100, exposing regions of the layer of photosensitive material 126 of the semiconductor device 120 to energy, as shown in a cross-sectional view in FIG. 5. The layer of photosensitive material 126 is developed, and the exposed regions (e.g., when a positive photoresist is used; alternatively, unexposed regions may be removed if a negative photoresist is used) of the layer of photosensitive material 126 are removed, as shown in FIG. 5. The layer of photosensitive material 126 is then used to pattern the material layer 124, e.g., by etching away exposed portions of the material layer 124 using the layer of photosensitive material 126 as a mask. The layer of photosensitive material 126 is then removed, leaving the patterned material layer 124 having features 125a and 125b formed thereon that correspond to patterns 106a and 106b for features on the mask 100, respectively, as shown in FIG. 6 in a top view.

Referring again to FIG. 3, when the lithography mask 100 is used to pattern a layer of photosensitive material 126 disposed on the semiconductor device 120, the extended assist features 108a and 108b of the patterns 106a and 106b, respectively, alter the energy passing by the patterns 106a and 106b for features, improving the imaging of the lithography system 110 and mask 100 onto a semiconductor device 120. A pattern of the extended assist features 108a and 108b is preferably not transferred to the layer of photosensitive material 126 or to the material layer 124 of the semiconductor device 120 in accordance with preferred embodiments of the present invention, as shown in the top view in FIG. 6. Rather, for example, the material layer 124 is patterned with the original desired layout or pattern shown on the lithography mask 100 in FIG. 1, for example, although the features 125a and 125b formed on the material layer 124 may be smaller or larger than the pattern of the mask 100. In many lithography systems 110, for example, a 4:1 reduction is used, so that the features 125a and 125b formed on the material layer 124 are about 4× smaller than patterns 106a and 106b for features on the mask 100. Alternatively, 1:1 ratios or other ratios may also be used for the patterns 106a and 106b and features 125a and 125b, for example.

Thus, in accordance with embodiments of the present invention, features 125a and 125b formed on the material layer 124 of the semiconductor device 120 have a dimension $d_6$ that corresponds to (e.g., is proportional to) the run length $d_1$ of the patterns 106a and 106b of the lithography mask 100 shown in FIG. 3. The features 125a and 125b also comprise a dimension $d_7$ that corresponds to the dimension $d_2$ between the two adjacent patterns 106a and 106b on the mask 100 shown in FIG. 3, for example. Advantageously, the extended assist features 108a and 108b improve the pattern transfer of the mask 100 to the semiconductor device 120. On the semiconductor device 120, the sub-resolution space of the extended assist features 108a and 108b fills in and is imaged as continuous, undeveloped photoresist 126, for example.

Embodiments of the present invention are particularly useful when implemented in immersion lithography systems 110, for example. In these embodiments, referring again to FIG. 4, the lithography system 110 may include a means for disposing a fluid between the projection lens system 114 and the semiconductor device 120, as shown in phantom at 116. The fluid, which may comprise de-ionized water or other liquid, is preferably introduced between a last element or lens of the projection lens system 114 and the semiconductor device 120 during the exposure process, e.g., by an immersion head 116 clamped to the end of the lens system 114. The fluid may be provided by a nozzle or by input and output ports within the immersion head, for example.

Alternatively, the lithography system 110 may comprise a lithography system that utilizes ultraviolet (UV) or extreme UV (EUV) light, an optical lithography system, an x-ray lithography system, an interference lithography system, or other types of lithography systems, as examples.

Embodiments of the present invention include novel methods of manufacturing semiconductor devices 120 using the novel lithography masks 100, 200, 300, 400, 500, and 600 and lithography systems 110 described herein, and semiconductor devices 120 manufactured using the novel lithography masks 100, 200, 300, 400, 500, and 600 and lithography systems 110, for example.

For example, referring again to the semiconductor device 120 shown in FIGS. 5 and 6, a method of manufacturing a semiconductor device 120 preferably comprises providing a lithography mask 100, the lithography mask 100 comprising at least one extended assist feature 108a or 108b that extends completely through a pattern 106a or 106b for a feature of a material layer of a semiconductor device 120.

The method includes providing a workpiece 122 having a layer of photosensitive material 126 disposed thereon, and affecting the layer of photosensitive material 126 using the lithography mask 100. The workpiece 122 may include a semiconductor substrate comprising silicon or other semiconductor materials covered by an insulating layer, for example. The workpiece 122 may also include other active components or circuits, not shown. The workpiece 122 may comprise silicon oxide over single-crystal silicon, for example. The workpiece 122 may include other conductive layers or other semiconductor elements, e.g., transistors, diodes, etc. Compound semiconductors, GaAs, InP, Si/Ge, or SiC, as examples, may be used in place of silicon. The workpiece 122 may comprise a silicon-on-insulator (SOI) substrate, for example.

A material layer 124 is deposited or formed over the workpiece 122. The material layer 124 may comprise an insulating material, a semiconductive material, a conductive material, or combinations thereof, as examples. In some embodiments, the material layer 124 may comprise a conductive material and/or semiconductive material that will be subtractively etched to form conductive lines. In other embodiments, the material layer 124 may comprise an insulating material that will be patterned with the shape of conductive lines and later filled with a conductive and/or semiconductive material to form conductive lines within the patterned insulating material, in a damascene (e.g., a single or dual damascene) process. The conductive lines that will be formed may comprise wordlines or bitlines of a memory device, conductive lines to connect logic and/or other circuitry, or gates of transistors, as examples. The material layer 124 may comprise a thickness of about 500 nm or less, although alternatively, the material layer 124 may be greater than 500 nm thick, for example. The material layer 124 may be patterned to form other types of circuit elements, such as transistor gates or other circuitry, for example.

A layer of photosensitive material 126 is deposited over the material layer 124. The layer of photosensitive material 126 is then affected using the lithography mask 100 of embodiments of the present invention shown in FIG. 3. Affecting the layer of photosensitive material 126 using the lithography mask 100 may include exposing the layer of photosensitive material 126 to energy through the lithography mask 100, for example.

In a preferred embodiment, a method of manufacturing a semiconductor device 120 includes exposing the layer of photosensitive material 126 using the novel lithography mask 100 to pattern portions of the layer of photosensitive material 126, developing the layer of photosensitive material 126, and then altering the material layer 124 of the semiconductor device 120 through the patterned layer of photosensitive material 126. Altering the material layer 124 may comprise etching the material layer 124, implanting the material layer 124 with a substance, or depositing another material layer over the material layer 124, as examples, although the material layer 124 may be altered in other ways in accordance with embodiments of the present invention.

Figure 7:
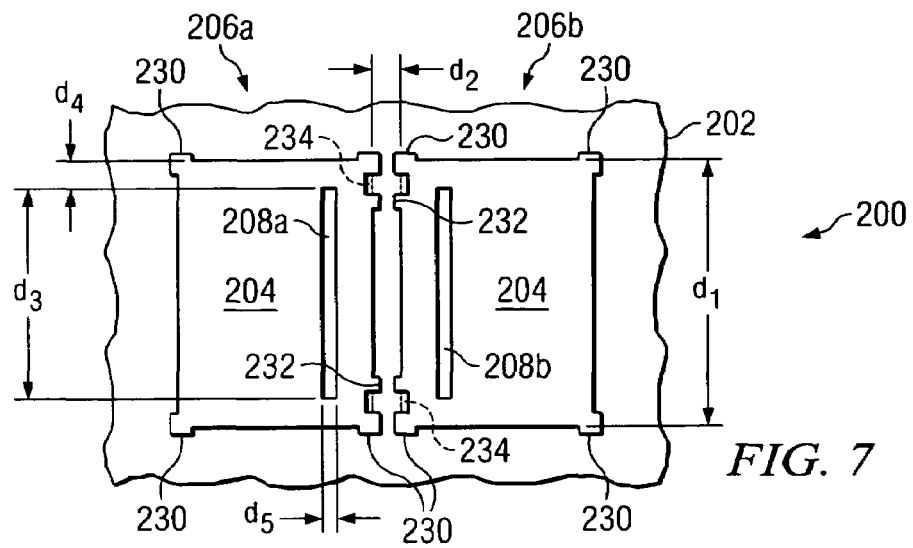
FIGS. 7, 8a, and 8b show top views of methods of designing lithography masks in accordance with embodiments of the present invention.
Figure 8A:
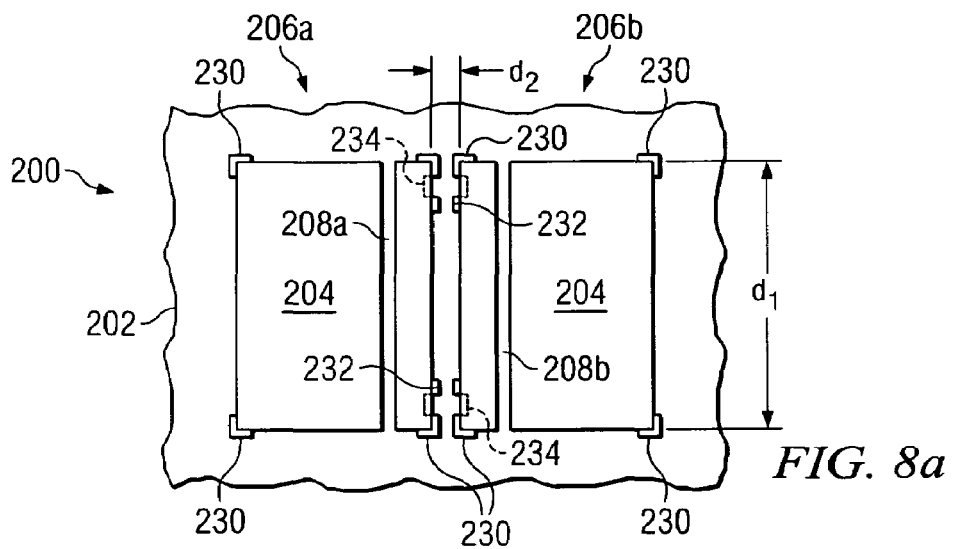
Figure 8B:
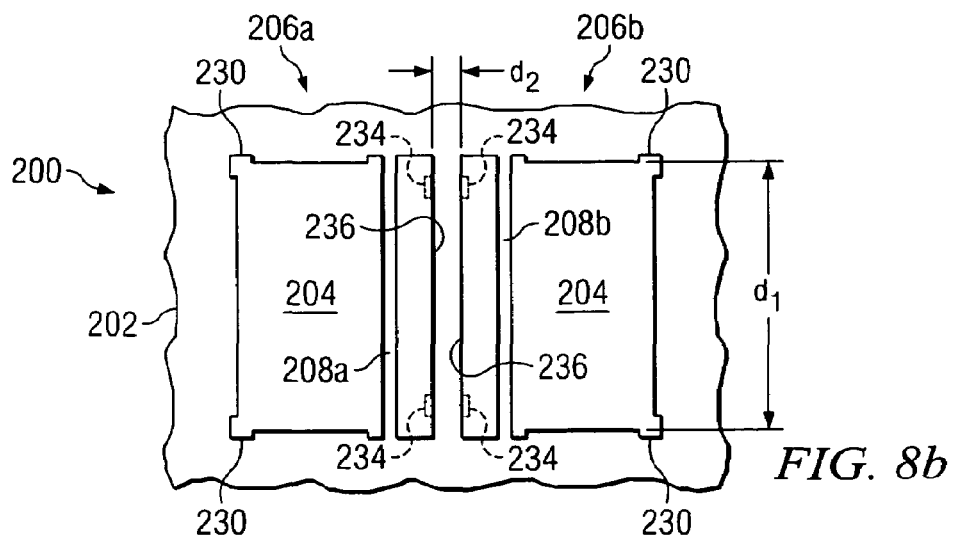

FIGS. 7, 8a, and 8b show top views of methods of designing a lithography mask in accordance with additional embodiments of the present invention. Like numerals are used for the various elements that were used to describe the previous Figures. To avoid repetition, each reference number shown in FIGS. 7, 8a, and 8b is not described again in detail herein. Rather, similar materials x02, x04, x06, x08, etc. . . . are preferably used for the various material layers shown as were described for FIGS. 1 through 6, where x=1 in FIGS. 1 through 6 and x=2 in FIGS. 7, 8a, and 8b. As an example, the preferred and alternative materials and dimensions described for the transparent and opaque materials 102 and 104 of the mask 100 shown in FIGS. 1 through 3 are also used for the transparent and opaque material 202 and 204 of the masks 200 shown in FIGS. 7, 8a, and 8b.

In FIG. 7, the original desired layout for a lithography mask 100 (e.g., a desired layout for a material layer of a semiconductor device) appeared as in FIG. 1, for example, wherein the patterns 106a and 106b comprise rectangular shapes having a run length of $d_1$. The run length may comprise a run length $d_1$ of greater than about 370 nm in some embodiments, for example. In FIG. 7, the layout for a lithography mask 200 is shown after assist features 208a and 208b are placed in patterns 206a and 206b, after OPC has been performed on the design. Ringing at the ends e.g., at the ends of edges proximate adjacent patterns 206a and 206b for features is attempted to be solved by OPC, by forming protrusions 232 and notches 234 along edges and serifs 230 at corners of the patterns 206a and 206b, as shown in the less-preferred embodiment in FIG. 7.

In accordance with preferred embodiments of the present invention, the assist features 208a and 208b are extended completely to the opposing edges of the patterns 206a and 206b of features, as shown in FIGS. 8a and 8b. For example, after the design phase shown in FIG. 7, e.g., after the design layout is provided for a material layer (see FIG. 1) and after OPC and placement of non-completely extended assist features 108a and 108b as shown in FIG. 7, the assist features 208a and 208b are then altered to extend them completely through the patterns 206a and 206b to the edges, as shown in FIG. 8a. The serifs 230, notches 234, and protrusions 232 formed during OPC are left remaining in this embodiment, for example.

However, in another embodiment, the assist features 208a and 208b may be placed in the features 206a and 206b after the layout is provided (as shown in FIG. 1). In this embodiment, the assist features 208a and 208b are then extended completely through the patterns 206a and 206b for features, before OPC. Then OPC is performed, wherein the OPC algorithm is preferably adapted not to fill in the transparent assist features proximate the edges of the patterns 206a and 206b, for example, as shown in FIG. 8b. The OPC patterns in this embodiment may appear differently in this embodiment than in the embodiment shown in FIG. 8a, for example. In this embodiment, ringing at the ends of the patterns 206a and 206b where the patterns 206a and 206b edges 236 are proximate one another may be prevented or reduced by the fully extended novel assist features 208a and 208b of embodiments of the present invention shown in FIG. 8b.

For example, in the embodiment shown in FIG. 8b, no serifs, indentations, or protrusions may be formed on the inner edges 236 of the patterns 206a and 206b, as shown. Or, alternatively, fewer or smaller serifs, indentations, and/or protrusions may be formed, as shown in phantom at the indentation 234 shown in FIG. 8b, for example, to reduce ringing effects. Advantageously, ringing effects are reduced by the extended assist features 208a and 208b of some embodiments of the present invention, so that fewer OPC corrections are required, for example. The novel lithography masks shown in FIGS. 8a and 8b having extended assist features 208a and 208b provide a sufficient process window and mask error enhancement factor (MEEF) for fabrication of semiconductor devices, for example.

Figure 9:
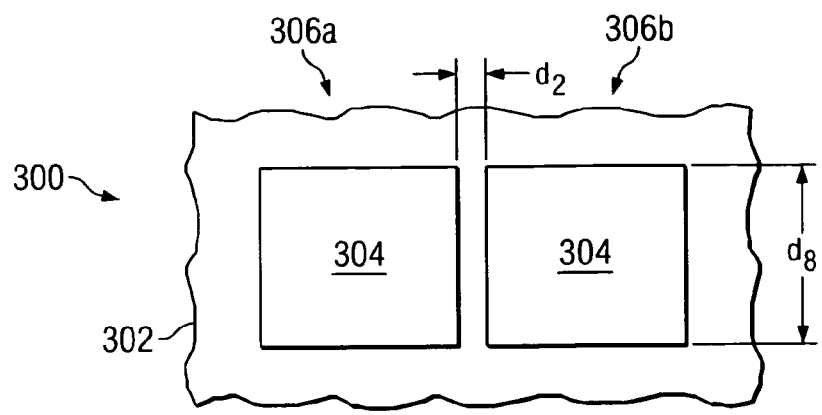
FIGS. 9 and 10 show top views of a method of designing a lithography mask in accordance with another embodiment of the present invention.
Figure 10:
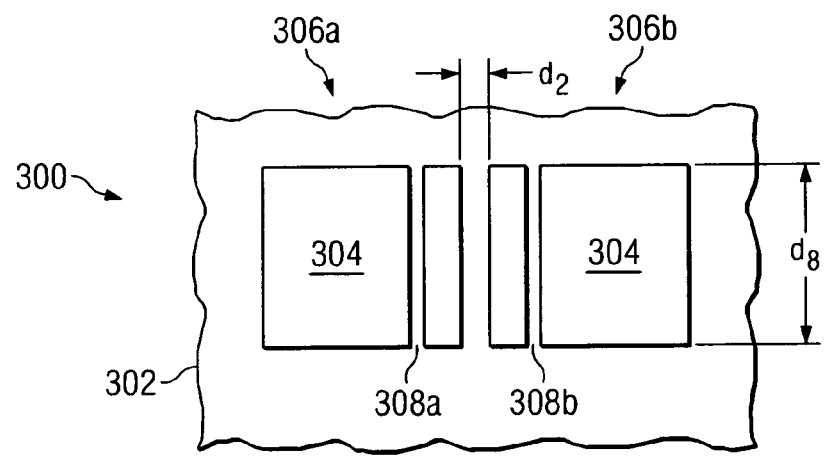

FIGS. 9 and 10 show top views of a method of designing a lithography mask 300 in accordance with another embodiment of the present invention. Again, like numerals are used for the various elements that were used to describe the previous figures, and to avoid repetition, each reference number shown in FIGS. 9 and 10 is not described again in detail herein.

In this embodiment, the design layout includes smaller patterns for features than are shown in FIGS. 1 through 3, and 7, 8a and 8b. For example, in FIG. 9 the layout for a material layer of a semiconductor device is shown for a lithography mask 300. The run length $d_g$ of the patterns 306a and 306b is smaller than in previous embodiments, e.g., the run length may be less than about 370 nm, as an example. Running a typical OPC on the layout may result in no assist features being placed in the patterns 306a and 306b, for example, due to the small size and inability to inspect the mask 300, which results in a poor process window and a reduced MEEF. However, in accordance with a preferred embodiment of the present invention, a fully extended assist feature 308a and 308b is placed in each pattern 306a and 306b, respectively, as shown in FIG. 10, resulting in a sufficient process window and increased MEEF.

Figure 11:
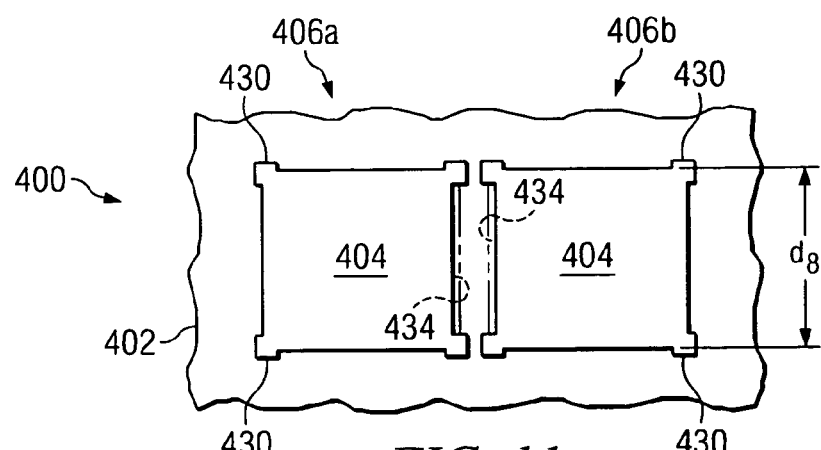
FIGS. 11 and 12 show top views of a method of designing a lithography mask in accordance with yet another embodiment of the present invention.
Figure 12:
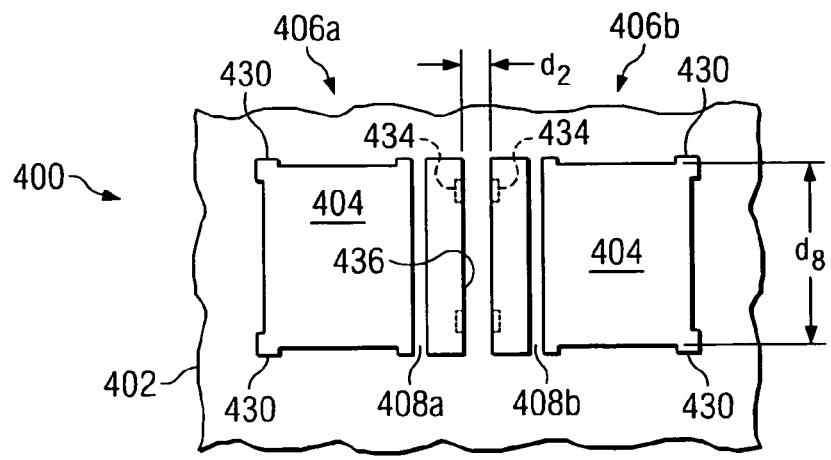

FIGS. 11 and 12 show top views of a method of designing a lithography mask 400 in accordance with yet another embodiment of the present invention. The original design layout comprised the same shape features as shown in FIG. 9, and then OPC was performed, in which serifs 430 were placed at all corners of the patterns 406a and 406b and notches 434 were formed along edges between the patterns 406a and 406b, but no assist features were formed in the patterns 406a and 406b, in accordance with a less preferred embodiment of the present invention as shown in FIG. 11.

However, in accordance with a preferred embodiment of the present invention as shown in FIG. 12, fully extended assist features 408a and 408b are formed in the patterns 406a and 406b, respectively. Furthermore, optionally, the serifs 430 and/or notches 434 may not be formed at the edges of the patterns 406a and 406b proximate the other pattern 406b and 406a, respectively. Also, preferably, a large notch 434 (see FIG. 11) is preferably not formed at the edge proximate the patterns 406a and 406b, also shown, and alternatively, one or more small notches 434 (see FIG. 12 in phantom) may optionally be used at the edges 436 of the patterns 406a and 406b proximate the adjacent pattern 406b and 406a to prevent or reduce ringing. Again, the lithography mask 400 shown in FIG. 12 results in a sufficient process window and MEEF, in accordance with embodiments of the present invention.

Figure 13:
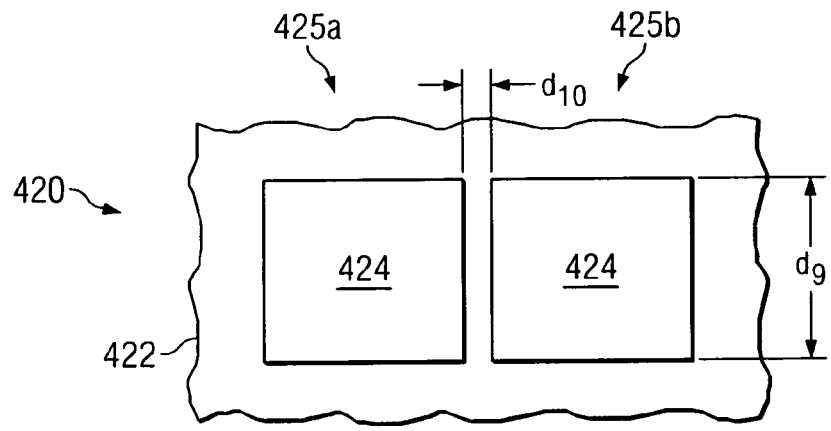
FIG. 13 shows a top view of a semiconductor device manufactured in accordance with the masks shown in FIG. 10 or FIG. 12.

FIG. 13 shows a top view of a semiconductor device 420 manufactured in accordance with the masks shown in FIG. 10 or FIG. 12. Advantageously, the fully extended assist features 308a, 308b, 408a, and 408b are not formed on the material layer 424 of the semiconductor device 420. The features 425a and 425b formed on the material layer 424 shown in FIG. 13 correspond to and correlate dimensionally to (e.g., are proportional to) the patterns 306a, 306b, 406a, and 406b comprising the fully extended features 308a, 308b, 408a, and 408b of embodiments of the present invention shown in FIGS. 10 and 12. For example, the run length $d_9$ of features 425a and 425b and space $d_{10}$ between the features 425a and 425b of the semiconductor device 420 are proportional to the run length $d_8$ and space $d_2$, respectively, between patterns 306a and 306b, 406a and 406b on the masks 300 and 400 shown in FIGS. 10 and 12, respectively, in accordance with embodiments of the present invention.

In the embodiments shown in the previous figures, examples are shown of fully extended transparent assist features 108a, 108b, 208a, 208b, 308a, 308b, 408a, and 408b formed in patterns 106a, 106b, 206a, 206b, 306a, 306b, 406a, and 406b comprised of an opaque material 104, 204, 304, 404. Embodiments of the present invention may also be implemented in layouts wherein opaque assist features are used in transparent portions of features, for example, to be described next.

Figure 14:
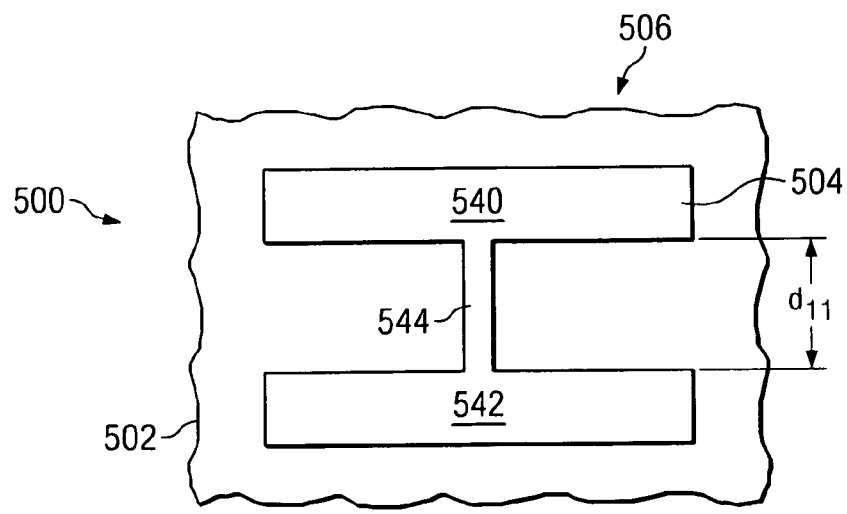
FIGS. 14 through 16 show top views of a method of designing a lithography mask in accordance with another embodiment of the present invention, wherein the assist features comprise opaque assist features that extend completely from a portion of a pattern for a feature to another portion of the pattern for the feature.
Figure 15:
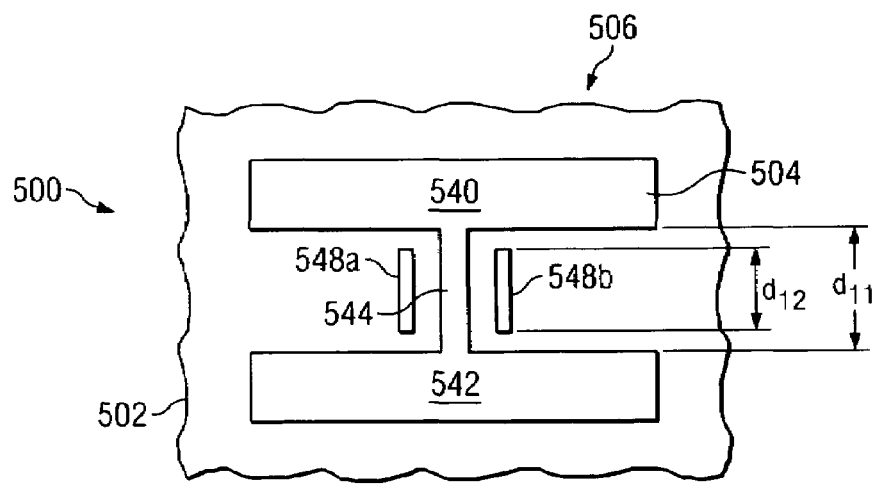
Figure 16:
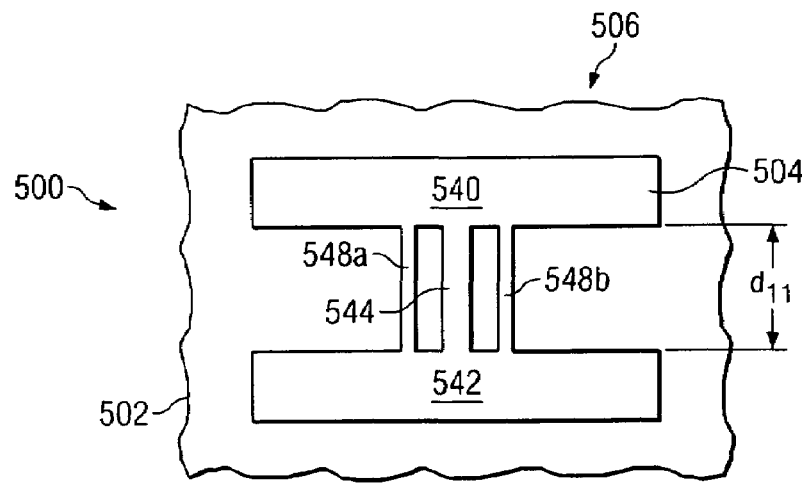

FIGS. 14 through 16 show top views of a method of designing a lithography mask 500 at various stages in accordance with another embodiment of the present invention, wherein extended assist features 548a and 548b comprise dark assist features. FIG. 14 shows a top view of a mask, illustrating a portion of a design layout for a material layer of a semiconductor device. The desired pattern 506 comprises a first portion 540 extending in a first direction, e.g., in a horizontal direction, a second portion 542 spaced apart from the first portion 540 that also extends in the first direction. The desired pattern 506 also comprises a third portion 544 that extends between and abuts the edges of the first portion 540 and the second portion 542, e.g., the third portion 544 extends in a vertical direction perpendicular to the first direction, connecting the first portion 540 and the second portion 542. The distance $d_{11}$ between the first portion 540 and the second portion 542 may comprise a run length of greater than about 320 nm in some embodiments, as an example, although distance $d_{11}$ may comprise other values. A transparent portion resides on both sides of the third portion 544 between the first portion 540 and the second portion 542 of the pattern 506.

FIG. 15 shows a pattern for the layout of FIG. 14 in accordance with a less-preferred embodiment of the present invention, which includes assist features 548a and 548b spaced apart from the first portion 540 and the second portion 542 by a minimum distance, in order to avoid mask 500 inspection issues. For example, the assist features 548a and 548b may comprise dark assist features comprised of opaque material 504, e.g., the same material the pattern 506 is comprised of, on an otherwise transparent background 502. The assist features 548a and 548b have a length $d_{12}$ that is less than the distance $d_{11}$, and the assist features 548a and 548b in the less preferred embodiment shown in FIG. 15 do not fully extend to the first portion 540 and the second portion 542 of the pattern 506, as shown.

FIG. 16 shows a pattern 506 for the layout shown in FIG. 14 in accordance with a preferred embodiment of the present invention, which includes assist features 548a and 548b disposed on both sides of the third portion 544 of the pattern 506, wherein the assist features 548a and 548b extend completely from one edge to another edge, e.g., from a first portion of the pattern to a second portion of the pattern.

In some embodiments, for example, the pattern 506 comprises a pattern 506 for at least one feature. The pattern 506 comprises an opaque pattern comprising a first portion 540 extending in a first direction and a second portion 542 spaced apart from the first portion 540 extending in the first direction. At least one assist feature 548a or 548b is formed by extending the assist feature 548a or 548b completely from the first portion 540 to the second portion 542 of the pattern 506 of the at least one feature of the semiconductor device.

In other embodiments, the layout includes a pattern 506 for at least one feature of the semiconductor device, wherein the pattern comprises a transparent portion, e.g., the portion of the pattern 506 disposed on either side of the third portion 544, between the first portion 540 and the second portion 542. The assist feature 548a or 548b may comprise at least one opaque assist feature 548a or 548b formed in the transparent portion of the pattern 506.

In some embodiments of the present invention, a method of fabricating a lithography mask 500 includes providing a layout for a material layer of a semiconductor device, the layout including a pattern 506 for a feature of the semiconductor device, the pattern 506 including a first portion 540 extending in a first direction and a second portion 542 spaced apart from the first portion 542, the second portion extending in the first direction. The method includes forming at least one assist feature 548a or 548b in the pattern 506 for the feature of the semiconductor device. Forming the at least one assist feature 548a or 548b may comprise extending the at least one assist feature 548a or 548b completely from the first portion 540 to the second portion 542 of the pattern 506 of the feature of the semiconductor device. The pattern 506 for the feature of the semiconductor device may include a third portion 544 disposed between and terminating at the first portion 540 and the second portion 542 of the pattern 506. Forming the at least one assist feature 548a or 548b may comprise forming a first assist feature 548a proximate a first side (e.g., the left side) of the third portion 544 of the pattern 506, and forming a second assist feature 548b proximate a second side (e.g., the right side) of the third portion 544 of the pattern 506, the second side being opposite the first side, e.g., on opposite sides about the third portion 544, as shown in FIG. 16.

Preferably, for example, in this embodiment, the pattern 506 for the feature of the semiconductor device comprises an opaque pattern 506 comprising the first portion 540, the second portion 542, and the third portion 544 and also comprising a transparent portion between the first portion 540 and the second portion 542. Forming the at least one assist feature 548a and 548b preferably comprises forming the at least one assist feature 548a or 548b in the transparent portion of the pattern 506 for the feature of the semiconductor device, for example.

The opaque assist features 548a and 548b preferably comprise a thickness or a width (e.g., on a thinnest side) of about 50 nm or less, and more preferably comprise a thickness of about 20 to 50 nm, as examples. In some embodiments, for example, the opaque assist features 548a and 548b preferably comprise a thickness of about 25 nm. The distance between the opaque assist features 548a and 548b to the third portion 544 of the pattern 506 preferably comprises about 200 nm or less, and more preferably comprises a distance of about 50 to 200 nm, as examples. In some embodiments, the distance between the opaque assist features 548a and 548b to the third portion 544 of the pattern 506 preferably comprises about 120 nm, as another example. The thickness of the first portion 540 and the second portion 542 of the pattern (e.g., on a thinnest side) may comprise about 100 nm, and in some embodiments may comprise about 40 nm, for example.

Figure 17:
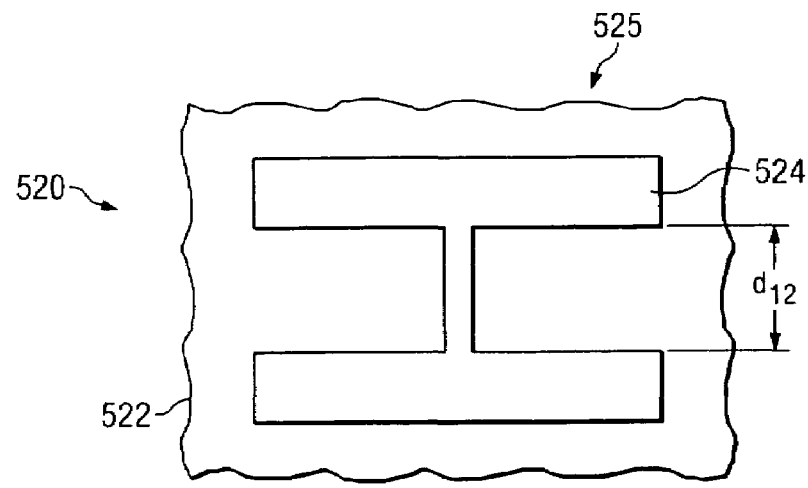
FIGS. 17 through 19 show top views of a method of designing a lithography mask in accordance with yet another embodiment of the present invention.

The fully extended assist features 548a and 548b improve the pattern transfer and result in the desired shape being formed on a material layer of a semiconductor device, as shown in a top view in FIG. 17. For example, the feature 525 formed on the semiconductor device 520 comprises the desired shape of the original design layout shown in FIG. 14, wherein distance $d_{12}$ between the horizontal extending portions of the features correlates to and/or is proportional to the run length $d_{11}$ between portions 540 and 542 of the lithography mask 500 shown in FIG. 16, for example.

Figure 18:
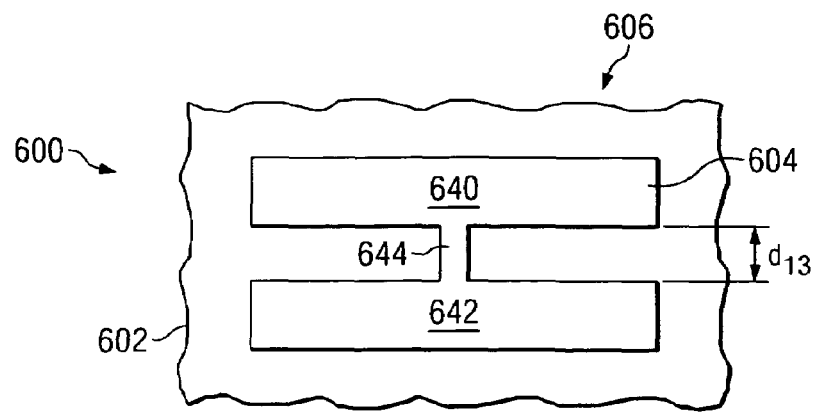
Figure 19:
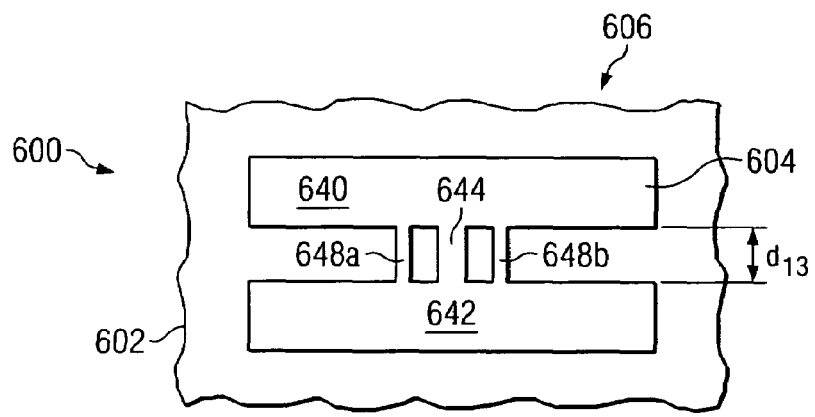

FIGS. 18 and 19 show top views of a method of designing a lithography mask at various stages in accordance with yet another embodiment of the present invention. The pattern 606 is similar to the shape of the pattern 506 shown in FIGS. 14 through 16, although the run length $d_{13}$ is smaller than run length $d_{11}$ of FIG. 16. The run length $d_{13}$ may comprise less than about 320 nm in this embodiment, as an example, although alternatively, the length $d_{13}$ may comprise other dimensions. FIG. 18 shows a less-preferred embodiment, wherein when OPC is performed on the design layout, no assist features are placed on the mask 600 design, resulting in a poor process window and MEEF. FIG. 19 shows a preferred embodiment of the present invention, wherein assist features 648a and 648b are placed proximate either side of a third portion 644 of the pattern 606 that are fully extended between horizontally extending first portion 640 and second portion 642, resulting in a sufficient process window and MEEF.

Figure 20:
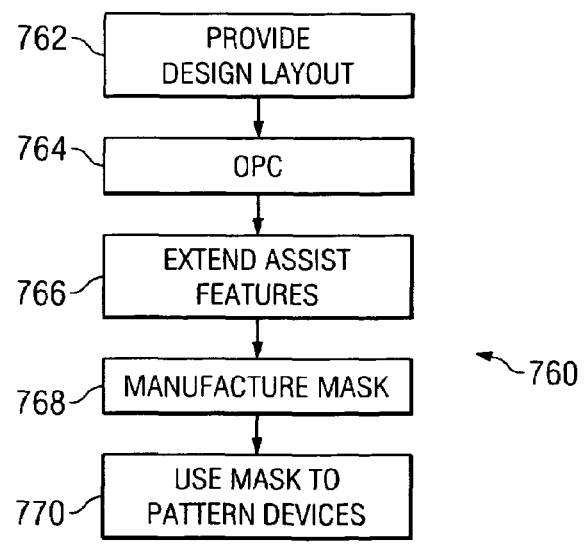
FIG. 20 is a flow chart of a process of designing and manufacturing a lithography mask, and using the mask to manufacture semiconductor device, in accordance with an embodiment of the present invention.

FIG. 20 is a flow chart 760 of a process of designing and manufacturing a lithography mask such as masks 100, 200, 300, 400, 500, and 600 described herein, and using the masks 100, 200, 300, 400, 500, and 600 to manufacture semiconductor devices, in accordance with an embodiment of the present invention. First, a design layout is provided (step 762). OPC may then be performed on the layout (step 764). The OPC may result in the placement of assist features on the layout, but the assist features do not fully extend through patterns, for example. The assist features determined by the OPC calculations may then be extended (step 766). The mask is then manufactured with the extended assist features (step 768). The mask is then used to pattern semiconductor devices (step 770).

Note that in other embodiments, after the design layout is provided, assist features may be placed on the layout that extend completely through the pattern or from one edge to an opposite edge of the design. OPC is then performed on the layout, and the mask is then manufactured with the extended assist features and OPC corrected layout. Preferably, during the OPC calculations, the assist features remain extended through the pattern. The mask is then used to pattern semiconductor devices.

The lithography masks 100, 200, 300, 400, 500, and 600 shown and described herein comprise binary masks; alternatively, the extended assist lines described herein may be implemented in lithography masks comprising phase shifting masks, alternating phase shifting masks, attenuating phase shifting masks, bright field masks, dark field masks, immersion lithography masks, or combinations thereof with binary masks, as examples.

When the patterns 106, 206, 306, 406, 506, 606 of the lithography mask 100, 200, 300, 400, 500, 600 are transferred to the semiconductor device 120, 420, 520 advantageously, lines, spaces, and other patterns printed on the layer of photoresist, and also on the material layer to be patterned, comprise substantially the desired shape and dimensions. The pattern transfer from the mask 100, 200, 300, 400, 500, 600 to the semiconductor device 120, 420, 520 is improved by extended assist features of embodiments of the present invention.

Referring again to FIGS. 4 and 5, note that the material layer 124 of the semiconductor device 120 may include a hard mask disposed over a layer of material to be patterned, not shown. In some embodiments, for example, the layer of photosensitive material 126 is patterned using the lithography mask, and then the layer of photosensitive material 126 is used to pattern the hard mask. The layer of photosensitive material 126 is then removed, and the hard mask is used to pattern the material layer, for example. Or, the layer of photosensitive material 126 may be left remaining over the hard mask, and both the layer of photosensitive material 126 and the hard mask may be used to pattern the material layer, for example.

The lithography masks 100, 200, 300, 400, 500, and 600, design and fabrication methods, lithography systems 110, and lithography methods described herein may be used to fabricate many types of semiconductor devices, including memory devices and logic devices, as examples, although other types of semiconductor devices, integrated circuits, and circuitry may be fabricated using the novel embodiments of the present invention described herein. Embodiments of the present invention may be implemented in lithography systems 110 using light at a wavelength of 193 nm, for example, although alternatively, other wavelengths of light or energy may also be used.

Advantages of embodiments of the invention include providing improvement of process windows and MEEF for isolated and semi-isolated spaces and lines below certain run lengths. General improvement of process windows and MEEF for end zones of isolated and semi-isolated spaces and lines and less OPC ringing is achieved by embodiments of the present invention. The novel extended assist features may be used may be used in patterns for features such as active areas, transistor gates, back end of line (BEOL) damascene line layers, and other circuit components and elements, as examples.

Embodiments of the present invention may be implemented in existing software and hardware used to generate and place sub-resolution assist features (SRAF), design software, and/or data preparation environments, or they may be implemented in new or additional software and hardware to lithography mask designs. Preferably, OPC software tools are adjusted and/or fine tuned to prevent the alteration of the shape of the assist features, particularly at the ends of the assist features, for example. Preferably the OPC algorithm is not allowed to fill in the assist feature space, thus leaving the vertex intersection (e.g., of the extended assist features with the edges of the patterns) untouched. As a result, ringing along the minimum space is greatly reduced, and minimum spaces with run lengths where insertion of SRAFs would result in feature sizes below mask manufacturing limits or mask inspection limits, for example about 370 nm in 65 nm technologies are achieved.

For transparent extended assist lines, the OPC accuracy is increased significantly, especially at the ends of isolated spaces, due to the more uniform proximity environment along the space, achieved by the extended assist lines of embodiments of the present invention. Improved accuracy is also achieved in a similar way for extended dark assist features in isolated line environments, for example.

In accordance with embodiments of the present invention, extended clear and dark assist features may be placed in virtually all design layouts that involve minimum isolated and semi-isolated resist spaces and lines. Design rule restrictions may be relieved by the use of the novel extended assist features of embodiments of the present invention.

Embodiments of the present invention include providing lithography masks for semiconductor devices having a more accurate pattern transfer, wherein features formed on the devices comprise a desired shape. Embodiments of the present invention also include methods of designing lithography masks, lithography masks, and lithography systems that utilize the novel lithography masks described herein.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of generating an assist feature of a lithography mask, the method comprising:
   providing a layout for a material layer of a semiconductor device, the layout including a pattern for at least one feature of the semiconductor device; and
   forming an assist feature in the pattern for the at least one feature, wherein the assist feature extends completely through the pattern for the at least one feature, and wherein the assist feature does not intersect with any other assist feature.

2. The method according to claim 1, wherein the pattern for the at least one feature includes a first edge and a second edge opposite the first edge, wherein forming the assist feature includes forming an assist feature that extends from the first edge to the second edge of the pattern for the at least one feature.

3. The method according to claim 1, wherein the pattern for the at least one feature of the semiconductor device comprises an opaque pattern comprising a first portion extending in a first direction and a second portion spaced apart from the first portion extending in the first direction, and wherein forming the assist feature comprises extending the assist feature completely from the first portion to the second portion of the pattern of the at least one feature of the semiconductor device.

4. The method according to claim 1, wherein providing the layout for the material layer of the semiconductor device comprises providing a layout including a pattern for a first feature of the semiconductor device and a pattern for a second feature of the semiconductor device proximate the pattern for the first feature, wherein forming the assist feature comprises forming a first assist feature in the pattern for the first feature proximate the pattern for the second feature, and wherein forming the assist feature further comprises forming a second assist feature in the pattern for the second feature proximate the pattern for the first feature.

5. The method according to claim 1, wherein providing the layout includes providing a layout wherein the pattern for the at least one feature of the semiconductor device comprises an opaque pattern and wherein forming the assist feature in the pattern for the at least one feature comprises forming a transparent assist feature, or wherein providing the layout includes providing a layout wherein the pattern for the at least one feature of the semiconductor device comprises a pattern comprising a transparent portion and wherein forming the assist feature in the pattern for the at least one feature comprises forming an opaque assist feature in the transparent portion of the pattern.

6. A method of fabricating a lithography mask, the method comprising:
   providing a layout for a material layer of a semiconductor device, the layout including a first pattern for a first feature of the semiconductor device and a second pattern for a second feature of the semiconductor device; and
   forming a first assist feature in the first pattern and a second assist feature in the second pattern, wherein the first assist feature extends completely through the first pattern and wherein the second assist feature extends completely through the second pattern, and wherein the first and the second assist feature do not intersect with any other assist feature.

7. The method according to claim 6, wherein forming the first assist feature in the first pattern and the second assist feature in the second pattern comprises forming the first assist feature proximate the second pattern and forming the second assist feature proximate the first pattern.

8. The method according to claim 6, further comprising performing optical proximity corrections (OPC) on the layout.

9. The method according to claim 8, wherein performing the OPC on the layout is before or after generating the first assist feature and the second assist feature.

10. The method according to claim 9, wherein performing the OPC on the layout does not comprise forming indentations, serifs, or notches on the first pattern proximate the second pattern, or forming indentations, serifs, or notches on the second pattern proximate the first pattern.

11. A method of fabricating a lithography mask, the method comprising:
    providing a layout for a material layer of a semiconductor device, the layout including a pattern for a feature of the semiconductor device, the pattern including a first portion extending in a first direction and a second portion spaced apart from the first portion, the second portion extending in the first direction; and
    forming at least one assist feature in the pattern for the feature of the semiconductor device, wherein forming the at least one assist feature comprises extending the at least one assist feature completely from the first portion to the second portion of the pattern of the feature of the semiconductor device.

12. The method according to claim 11, wherein the pattern for the feature of the semiconductor device includes a third portion disposed between and terminating at the first portion and the second portion of the pattern.

13. The method according to claim 12, wherein forming the at least one assist feature comprises forming a first assist feature proximate a first side of the third portion of the pattern and forming a second assist feature proximate a second side of the third portion of the pattern, the second side being opposite the first side.

14. The method according to claim 12, wherein the pattern for the feature of the semiconductor device comprises an opaque pattern comprising the first portion, the second portion, and the third portion and a transparent portion between the first portion and the second portion, wherein forming the at least one assist feature comprises forming the at least one assist feature in the transparent portion of the pattern for the feature of the semiconductor device.

15. A method of manufacturing a semiconductor device, the method comprising:
   providing a lithography mask, the lithography mask comprising a layout including a pattern for at least one feature of the semiconductor device, an assist feature disposed in the pattern for the at least one feature, the assist feature extending completely through the pattern for the at least one feature, and wherein the assist feature does not intersect with any other assist feature;
   providing a workpiece, the workpiece having a layer of photosensitive material disposed thereon; and
   affecting the layer of photosensitive material using the lithography mask.

16. The method according to claim 15, wherein affecting the layer of photosensitive material using the lithography mask comprises exposing the layer of photosensitive material to energy through the lithography mask.

17. The method according to claim 15, wherein providing the workpiece comprises providing a workpiece having a material layer disposed thereon, the layer of photosensitive material being disposed over the material layer, further comprising:
   exposing the layer of photosensitive material, patterning portions of the layer of photosensitive material;
   developing the layer of photosensitive material; and
   altering the material layer through the patterned layer of photosensitive material.

18. The method according to claim 17, wherein providing a workpiece having a material layer disposed thereon comprises providing a workpiece having a material layer disposed thereon comprising a conductive material, a semiconductive material, an insulating material, or combinations thereof.

19. The method according to claim 18, wherein altering the material layer comprises etching the material layer, implanting the material layer with a substance, or depositing another material layer over the material layer.

20. A lithography mask, comprising:
   a pattern for at least one feature of a semiconductor device; and
   an assist feature disposed in the pattern for the at least one feature, wherein the assist feature extends completely from a first edge of the pattern for the at least one feature to a second edge of the pattern for the at least one feature, wherein the second edge is opposite the first edge, and wherein the assist feature does not intersect with any other assist feature.

21. The lithography mask according to claim 20, wherein the assist feature comprises a sub-resolution assist feature.

22. The lithography mask according to claim 20, wherein the lithography mask comprises a binary mask, a phase shifting mask, an alternating phase shifting mask, an attenuating phase shifting mask, a bright field mask, a dark field mask, an immersion lithography mask, or combinations thereof.

23. A method of fabricating a lithography mask, the method comprising:
   providing a layout for a material layer of a semiconductor device, the layout including a first patter for a first feature of the semiconductor device and a second pattern for a second feature of the semiconductor device;
   performing an optical proximity correction (OPC) on the layout; and
   generating a first assist feature in the first pattern and a second assist feature in the second pattern, wherein the first assist feature extends completely through the first pattern and wherein the second assist feature extends completely through the second pattern, wherein the OPC is performed before generating the first assiste feature and the second assist feature.

* * * * *